(12) United States Patent
Wickramanayaka

(10) Patent No.: US 6,216,632 B1
(45) Date of Patent: Apr. 17, 2001

(54) PLASMA PROCESSING SYSTEM

(75) Inventor: Sunil Wickramanayaka, Tokyo (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/227,413

(22) Filed: Jan. 8, 1999

(30) Foreign Application Priority Data

Jan. 29, 1998 (JP) .................................................. 10-032170

(51) Int. Cl.$^7$ .................................................. C23C 16/00
(52) U.S. Cl. .................................................. 118/723 E
(58) Field of Search ........................ 118/723 MA, 723 E, 118/723 I, 723 MW; 156/345

(56) References Cited

U.S. PATENT DOCUMENTS

| | | | |
|---|---|---|---|
| 5,733,405 | * | 3/1998 | Taki et al. ............................. 156/345 |
| 5,767,628 | * | 6/1998 | Keller et al. ..................... 315/111.51 |
| 5,938,883 | * | 8/1999 | Ishii et al. ............................. 156/345 |

OTHER PUBLICATIONS

Magnetically Enhanced Dual Frequency Capacitively Coupled Plasma Source For Large–Area Wafer Processing; Jpn. J. Appln. Phys. vol. 37; pp. 6193–6198; Nov., 1998.

* cited by examiner

Primary Examiner—Richard Bueker
Assistant Examiner—Erin Fieler
(74) Attorney, Agent, or Firm—Burns, Doane, Swecker & Mathis, LLP

(57) ABSTRACT

A plasma processing system includes a reactor having a plasma source and a substrate holder. The reactor is configured by a top plate made of a nonmagnetic metal, a bottom plate made of a metal, and a cylindrical side wall having at least in part a section made of ceramic. The substrate holder is placed in the bottom plate. A plurality of magnets is separately arranged on the top plate. The polarity of the magnets facing the inside of the reactor is alternately changed, and the magnets generate a magnetic field with closed magnetic fluxes near to the inner surface of the top plate.

15 Claims, 12 Drawing Sheets

Table 1

| diameter(mm) | non-uniformity(±%) | |
|---|---|---|
| (in the center) | magnet arrangement(I) | magnet arrangement(II) |
| 200 | 9.4 | 1.8 |
| 250 | 13.5 | 4.9 |
| 300 | 19.5 | 9.1 |

PLASMA PROCESSING SYSTEM

BACKGROUND OF THE INVENTION

1. Field of Industrial Application

The present invention relates to a plasma processing system, and more particularly, to a plasma processing system having an improved plasma source capable of supplying ions, electrons, neutral radicals and ultra-violet and visible light useful for a process of chemical vapor deposition (CVD) or etching micron-scale elements on integrated circuits in the semiconductor industry.

2. Discussion of Related Art

With the advance of 300 mm Si wafers (substrates) in the semiconductor industry, high density plasmas with uniform plasma density over the front surface of a substrate to be processed are greatly required. Even though the scale-up of existing plasma systems designed to process 200 mm wafers is one approach to meet the requirement, it is impeded by hardware difficulties of the existing plasma systems. Two such conventional plasma sources are illustrated in FIGS. 14 and 15, which are mainly used for the conventional 200 mm wafer plasma processing systems.

One example of the conventional plasma sources shown in FIG. 14, has a reactor 50 made of a metal, which is formed by a top plate 51, a bottom plate 52 and a cylindrical side wall 53. In the reactor 50, a substrate holder 54 on which a wafer or a substrate 61 is loaded is disposed at a lower position close to the bottom plate 52, and is parallel to both the top plate 51 and the bottom plate 52. The substrate holder 54 is electrically isolated from the reactor 50 by an insulator 57 and is supplied with a rf current generated by a rf electric power source 55 through a matching circuit 56 and a capacitor 60. The reactor 50 is electrically grounded through a wire 58. In accordance with the configuration of the reactor 50, a plasma is generated in the space 59 between the top plate 51 and the substrate holder 54 on the basis of capacitive coupling of rf electrical power.

FIG. 15 shows the other example of a conventional plasma source. In this example, the configuration of reactor 70 is almost the same as the reactor 50 shown in FIG. 14, except for an extra rf electrode 71. The reactor 70 also has the top plate 51, the bottom plate 52 and the cylindrical side wall 53, and it is made of a metal. Further, the reactor 70 is provided with the substrate holder 54 on which the substrate 61 is loaded, the rf electric power source 55, the matching circuit 56, the capacitor 60, the insulator 57 and the ground wire 58. The rf electrode 71 is placed slightly below the top plate 51 parallel to the substrate holder 54. The top rf electrode 71 is electrically isolated from the reactor 70 and is given a rf current by a rf electric power source 72 through a matching circuit 73. The rf current supplied to the rf electrode 71 usually has a frequency that is higher than that supplied to the substrate holder 54. The plasma is generated between the rf electrode 71 and the substrate holder 54 by the capacitive coupling of rf electrical power.

One of the major problems of the conventional plasma sources shown in FIGS. 14 and 15 is that the power transfer efficiencies from the rf electric sources (55, 72) to the plasma is low. This is due to the consumption of a considerable fraction of the applied rf power by unwanted ion acceleration. This is an inherent property of the capacitively coupled plasmas, and results in a lower plasma density. Further, since the 300 mm wafer processing is combined with the 0.25 m technology, it is considered that chemical processes must be carried out at a lower pressure, for example, about 10 mTorr. However, the plasma density of capacitively coupled plasmas further drops with the lowering of pressure. Thus, a higher process rate that is required for an economically viable system can not be obtained.

If the diameter of the substrate to be processed is small, for example, it is 200 mm, a higher rf electric power can be applied to increase the plasma density. If the diameter of the substrate to be processed is 300 mm, however, the applied rf power must be increased at least by 2.25 times in order to maintain the same power density because the surface area of the 300 mm wafer is 2.25 times larger than that of the 200 mm wafer. Therefore, the requirement for the rf electric power to maintain the desirable power density may limit some of applications.

In addition, when a 200 mm wafer processing system is scaled up to a 300 mm wafer processing system, the pumping speed in a processing chamber also must be increased in order to maintain the same reaction rates.

Owing to these hardware difficulties, the conventional plasma sources for a 200 mm wafer shown in FIGS. 14 an 15 can not be simply scaled up for 300 mm wafer plasma sources. In order to avoid these problems, it is important to design plasma sources that yield a higher plasma density over a 300 mm diameter region. Further, there must be a higher plasma uniformity over the surface of the 300 mm wafer because some semiconductor processing methods, such as a plasma assisted anisotrophic etching method, need a plasma uniformity more than 95% over the whole surface of the substrate to be processed.

OBJECTS AND SUMMARY

An object of the present invention is to provide a plasma processing system for producing a magnetically enhanced, capacitively coupled, planar plasma, which can yield a high density plasma over a large area with a uniform plasma density by the combination of a capacitive coupling mechanism and electron confinement by a magnetic field, for the chemical vapor deposition and etching of large area substrate used in semiconductor industry.

Further, another object of the present invention is to realize a plasma source with a lower aspect ratio.

A plasma processing system of the present invention, in order to attain the above-mentioned object, comprises a reactor including a plasma source and a substrate holder, which is configured by a top plate made of a nonmagnetic metal, a bottom plate made of a metal, and a side wall having at least in part a section made of a dielectric material, wherein the substrate holder is placed in the bottom plate. The system further includes a plurality of magnets separately arranged in the outside of the top plate, wherein the polarity of the magnets facing the inside of the reactor is alternately changed, and the magnets generate a magnetic field with closed magnetic fluxes near to the inner surface of the top plate.

In accordance with another aspect of the above-mentioned invention, the arrangement of magnets on the top plate makes a desirable magnetic field and magnetic field cusps below the top plate. In the magnetic field, the magnetic flux lines are generated in the space near to the inner surface of the top plate and all of the magnetic flux lines are closed to make loops. This magnetic field controls electrons and enhances capacitively coupled planar plasma to yield a high density plasma over a large area with a uniform plasma density.

In the above-mentioned configuration, the top plate may be of a planar circular shape, and the magnets may be directly fixed to the outer surface of the planar top plate. This top plate can be made as a simple form.

In the above-mentioned configuration, the top plate can be of a dome shape. This dome shaped top plate can change the arrangement of the magnets to desirable one.

In the above-mentioned configuration, the magnets can be arranged on the inner surface of a dome shaped cover that lies over said dome shaped top plate. In accordance with the magnet arrangement, the magnetic field formed within the reactor can be desirable.

In the above-mentioned configurations, the top plate can be electrically isolated from the rest of the reactor by placing the top plate on a section made of a dielectric material.

In the above-mentioned configurations, the top plate can be supplied with a rf electrical power.

In the above-mentioned configuration using the planar top plate, the magnets are preferably arranged on an edge region of the top plate by leaving a magnetic field-free region in the center of the top plate.

In the above-mentioned configuration, using the dome shaped top plate, the dome shaped cover where the magnets are fixed on its inner surface can be rotated.

DETAILED DESCRIPTION OF THE PREFERRED EMBODIMENTS

Hereinafter, preferred working examples will be explained according to the attached drawings. Through the explanation of the working examples, the details of the present inventions will be clarified.

Figure 1:
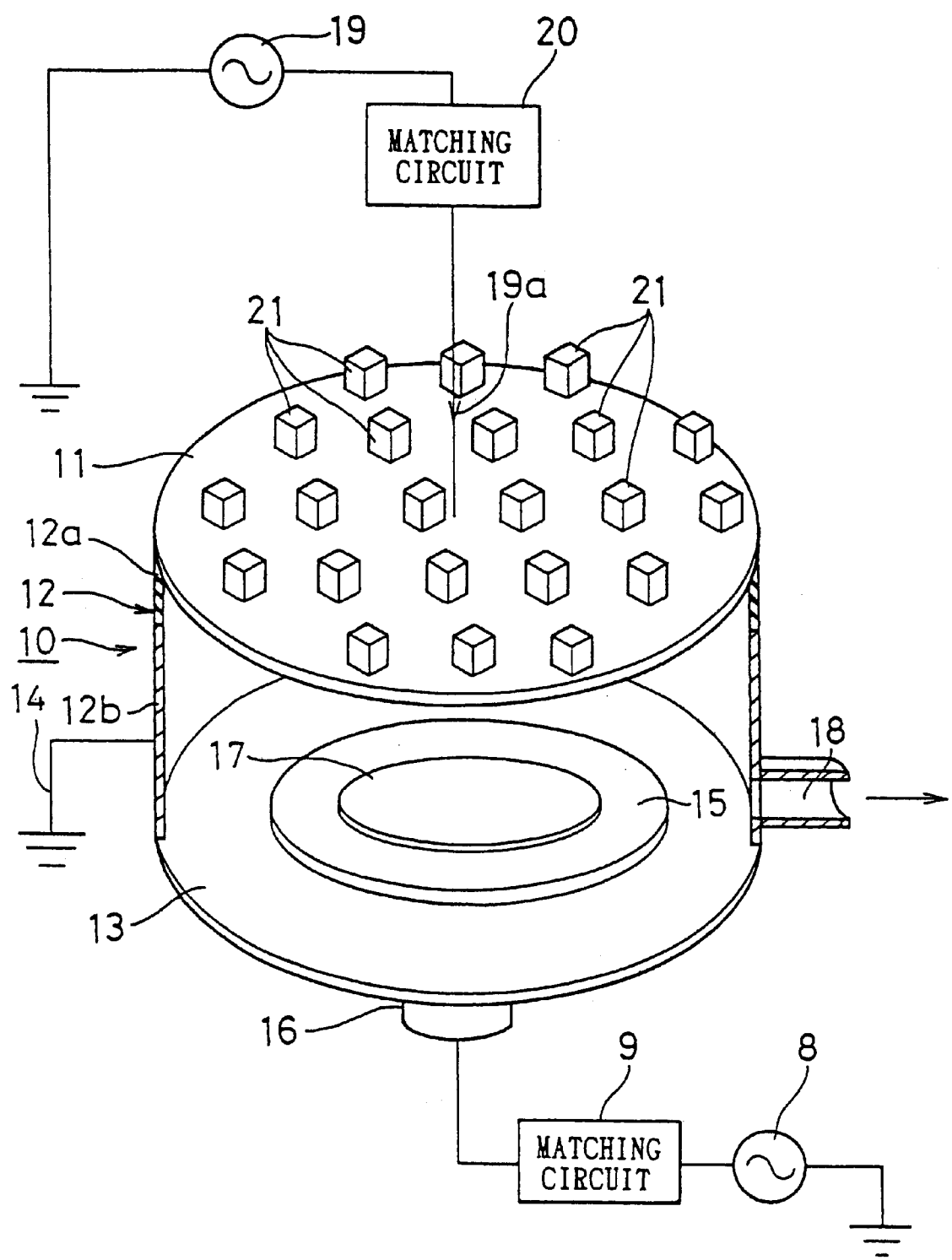
FIG. 1 is a perspective illustration of a first working example showing inner and outer structures of a plasma processing system.

A first working example of the present invention will be explained in accordance with FIGS. 1–4. FIG. 1 shows a whole configuration of a plasma source used for the plasma processing system of the first working example. Specifically, FIG. 1 shows the structure on an upper side (outside) of the plasma source and the inside structure thereof. The geometry of a reactor 10 forming the plasma source is explained first. The reactor 10 is formed by a top plate 11, a cylindrical side wall 12, and a bottom plate 13. The lower part 12b of the cylindrical side wall 12 and the bottom plate 13 are made of a metal, for example, stainless steel or Al. The upper part 12a of the cylindrical side wall 12 is made of a ceramic (dielectric material). The top plate 11 is of a planar circular shape and is made of a nonmagnetic metal, for example, Al. The top plate 11 is electrically isolated from the rest of reactor 10, because it is placed on the upper part 12a of the cylindrical side wall 12. The top plate 11 operates as an electrode when generating a plasma. The diameters of the upper part 12a and the lower part 12b of the cylindrical side wall 12 are the same. The diameter is not critical, and can be varied from 40 cm to 60 cm. The height of the ceramic part (12a) of the cylindrical side wall 12 is also not critical, and lies in the region of 1 cm to 5 cm. The lower part 12b of the cylindrical side wall 12 and the bottom plate 13 are electrically grounded through an earth line 14. The diameter of the top plate 11 is comparable to the diameter of the cylindrical side wall 12.

In the inner space of the reactor 10, there is a substrate holder 15 mounted to the bottom plate 13 by an insulator 16. This substrate holder 15 is, for example, coupled to a conventional rf electric power source 8 through a matching circuit 9. The rf electric power source 8 is disposed at the outside of the reactor 10. A wafer or a substrate 17 to be processed is loaded on the substrate holder 15. A gas outlet port 18 is used as an evacuation port. The gas outlet port 18 is connected to a conventional pumping unit (not shown). The top plate 11 is coupled to an rf electric power source 19 through a matching circuit 20. The top plate 11 is provided with the necessary rf electric power from the rf electric power source 19.

The substrate holder 15 is placed in the reactor 10 parallel to the bottom plate 13. The substrate holder 15 is electrically isolated from the reactor 10 by the insulator 16. Although FIG. 1 shows the rf electric power source 8 coupled to the substrate holder 15 through the matching circuit 9, the substrate holder 15 may or may not be practically coupled to the rf electric power source depending on the type of application. If the substrate holder 15 is given the rf electric power, the frequency of the rf power is usually lower than that supplied to the top plate 11 by the rf power source 19. Otherwise, the substrate holder 15 is grounded.

Figure 3:
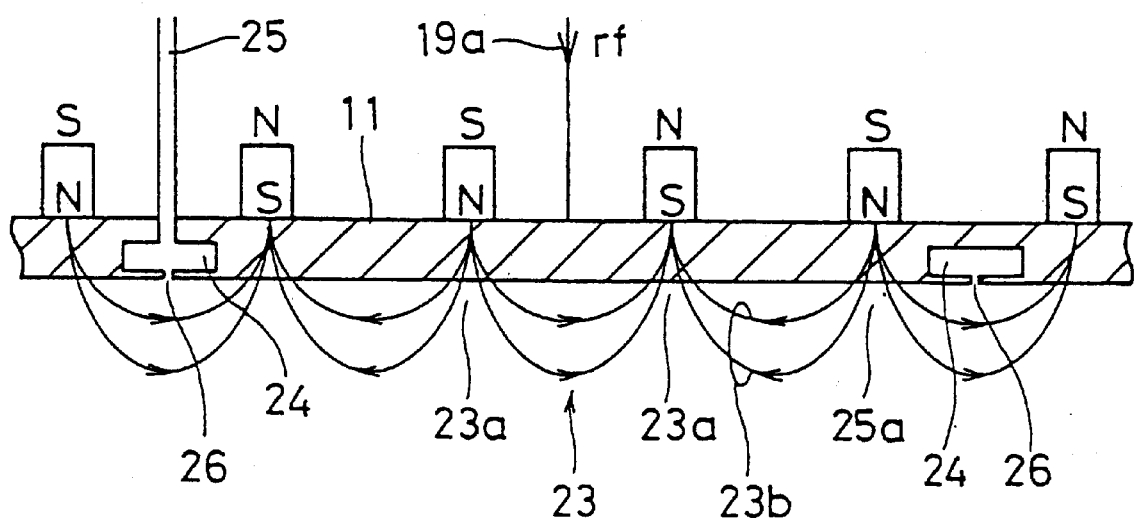
FIG. 3 is a partially sectional view of a top placed in a plasma source showing an inner structure and a magnetic field.
Figure 4:
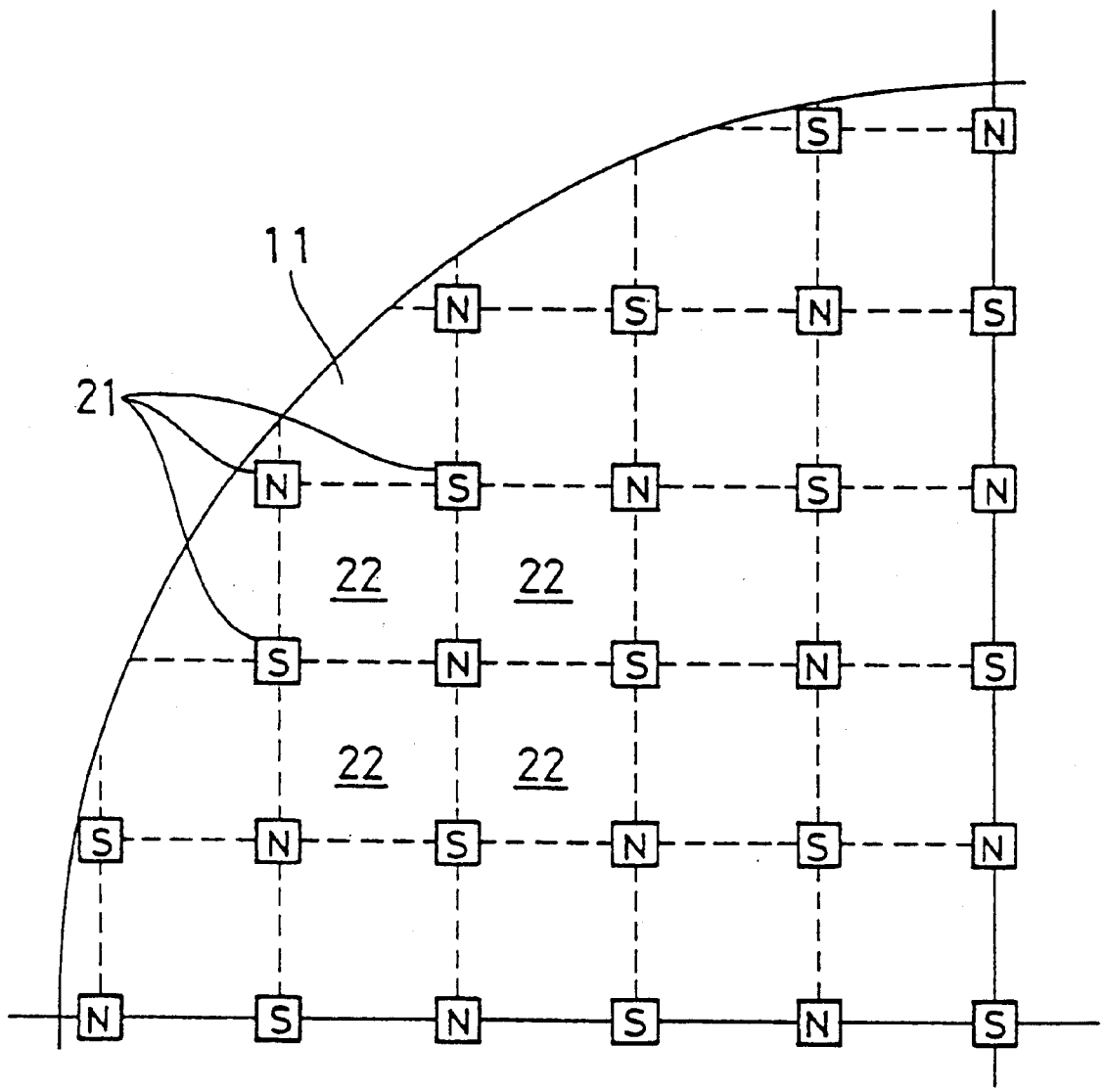
FIG. 4 is a plan view of ¼ of the area of the top plate showing a magnetic arrangement (I).

As shown in FIGS. 1, 3 and 4, a plurality of magnets 21 are arranged on the top plate 11 and further are directly fixed to the outer surface of the top plate 11. Since the magnets 21 are arranged symmetrically, only a ¼ area of the top plate 11 in a plan view is shown in FIG. 4. The magnets 21 can be arranged in different ways on the outer surface of the top plate 11. However, it is preferable that each neighboring magnet must have an opposite polarity facing the top plate 11. This means that polarity of the magnets facing the inside of the reactor is alternately changed. For example, the magnets 21 can be placed on each corner of a square 22 drawn by dotted lines on the top plate 11 as shown in FIG. 4. In FIGS. 3 and 4, "N" and "S" means magnetic polarity of the magnets 21. The separation (distance) between any two neighboring magnets 21 is not critical and preferably may vary from 2 cm to 10 cm depending on the strength of the magnets and the diameter of the top plate 11. The arrangement of magnets 21 makes a magnetic field 23 and magnetic field cusps 23a below the top plate 11 as shown in FIG. 3. The magnetic flux lines 23b emitted from a magnetic pole immediately bend to the nearest opposite magnetic poles making magnetic field cusps. The magnetic field 23 is generated in the space near to the inner surface of the top plate 11 and all of the magnetic flux lines 23b are closed to make loops. In the vicinity of the inner surface of the top plate 11, many flux loops 23a are formed and as a result the magnetic field cusps are formed. Depending on the arrangement structure formed by the magnets 21 on the top plate 11, the plasma uniformity below the top plate 11 changes.

Figure 2:
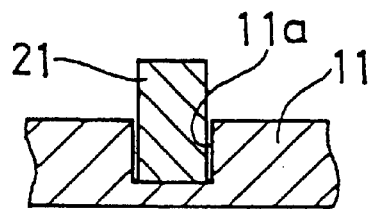
FIG. 2 is a partially sectional view of a top plate showing a fixing structure of the magnet.

As shown in FIG. 2, each of the magnets 21 may be placed in a hold 11a formed on the outside surface of the top plate 11. The thickness of the top plate 11 is about 20 mm and the depth of the hole 11a is about 17 mm, for example. So the bottom surface of the magnet 21 is near to the inside space of the reactor 10.

The cross sectional shape of the magnetic 21 may be circular or square. If the cross sectional shape of the magnets 21 is circular, the diameter may lie in the range of 10 mm to 40 mm. The value of the diameter is not critical. If the cross sectional shape of the magnets 21 is square, a comparable dimension to those of the magnets with a circular cross sectional shape is selected. The height of the magnet 21 is also not critical and may lie over 10 mm. The magnetic strenghth of the magnet 21 is selected in order to have a magnetic field strength of about 100 Gauss to 500 Gauss below the top plate 11.

In addition, as shown in FIG. 3, a circular gas channel 24 is formed within the top plate 11. The circular gas channel 24 is connected to a gas supply source (not shown) by a gas supply pipe 25, and has a plurality of gas inlet holes 26 on the inside surface of the top plate 11. A process gas supplied by the gas supply source is introduced into the inside space of the reactor 10 through the circular gas channel 24 and the gas inlet holes 26. The process gas is first fed to the circular gas channel 24 and then introduced into the inside space of the reactor 10 through several gas inlet holes 26.

The pressure inside the reactor 10 is controlled by adjusting the gas flow rates and a well-known variable orifice (not shown) placed at the gas outlet port 18. The pressure inside the reactor 10 may be varied from 1 mTorr to 100 mTorr, for example. The suitable pressure is determined by the type of application.

The frequency of the rf electric power source 19 lies in the range of about 1 MHz to 100 MHz, typically being operated at the frequency of 13.56 MHz. The rf electric power source 19 usually has a low impedance, typically about 50 ohms and is capable of producing an electric current from about 10 to 50 amps. The output of the rf electric power source 19 is fed to the center of the top plate 11 through a matching circuit 20.

If the rf electric power is applied to the substrate holder 15 by the rf electric power source 8, the frequency of the rf power may lie in the region of 100 kHz to 15 MHz. This rf electric power source 8 also has a low impedance, typically about 50 ohms and is capable of producing an electric current from about 1 amps to 50 amps. The rf electrical power is applied to the substrate holder 15 through a matching circuit 9.

Then, the mechanism of plasma generation in the reactor 10 with the above-mentioned plasma source is explained.

When the rf current 19a is applied to the top plate 11 from the rf electric power source 19, a plasma is generated by capacitive coupling of the rf electric power. Electrons in the plasma then undergo cyclotron rotation due to the existence of the magnetic field 23 produced by the magnets 21 arranged on the top plate 11. This causes an increase of path length for the electrons and thereby a higher ionization rate of the process gas. In addition, the bombardment of electrons and ions on to the top plate 11 is partially suppressed by the magnetic field 23. Therefore, the existence of the magnetic field 23 results in an increase of plasma density.

Generally, in the absence of a magnetic field, a plasma generated between two parallel plates by capacitive coupling has a higher radial uniformity. In the presence of a magnetic field this plasma uniformity changes. The magnets 21 placed on the top plate 11 in the first working example form the magnetic field 23 and the magnetic field cusps 23a below the top plate 11. At places where the strength of the magnetic field 23 that lies parallel to the top plate 11 is maximum, the plasma density is maximum. Similarly, at places where the strength of magnetic field 23 that lies parallel to the top plate is minimum, the plasma density is low. Therefore, at the vicinity of the top plate 11, the plasma density has maximums and minimums. However, since these maximums and minimums of the plasma density are close to each other, diffusion makes the plasma uniform at a short distance from the top plate 11 in the downstream. Further, since the magnets 21 are arranged with alternative polarities, flux lines 23b of the magnetic field 23 bend at a close distance from the inside surface of the top plate 11. Therefore, a magnetic field free environment can be obtained at a close distance from the top plate 11.

Figure 5:
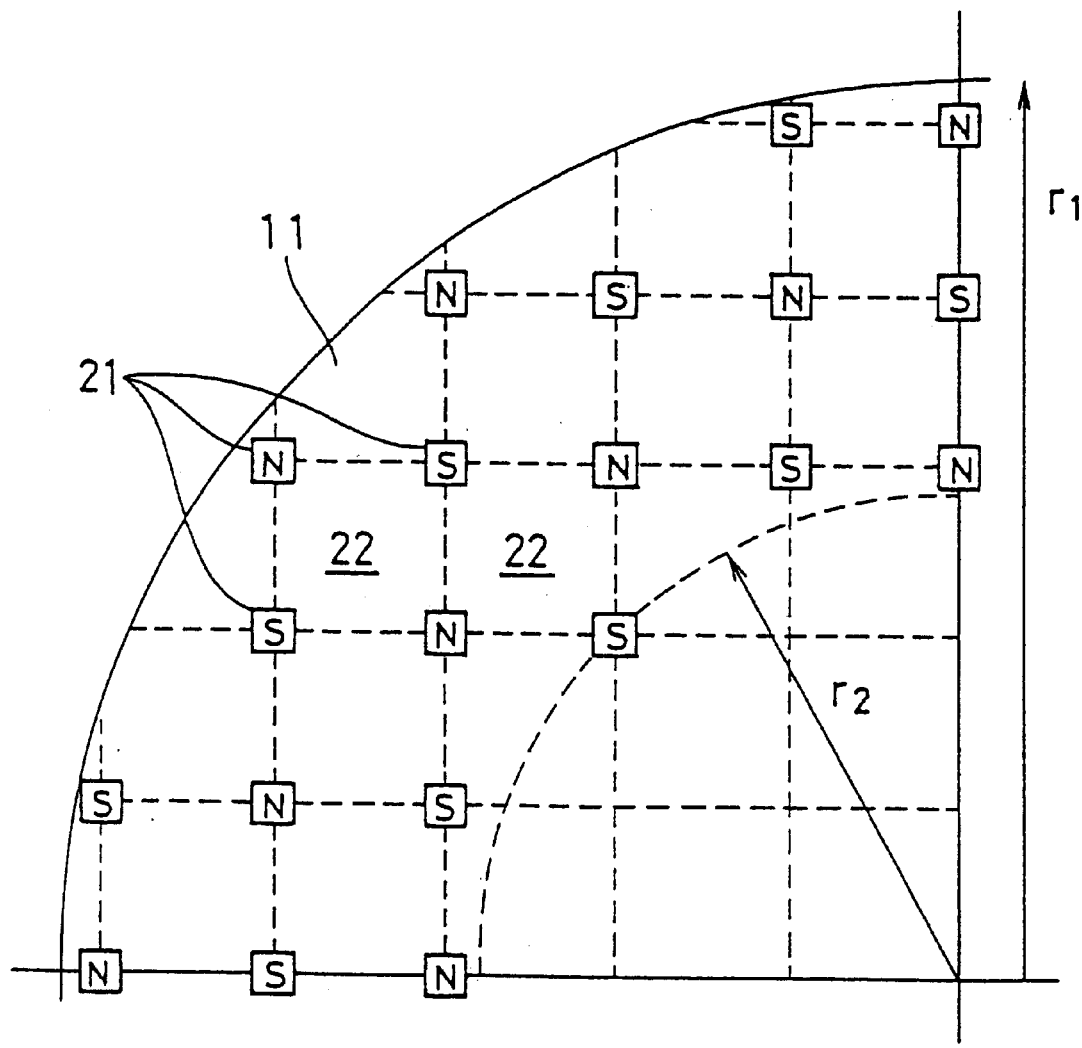
FIG. 5 is a plan view of ¼ of the area of the top plate showing a magnetic arrangement (II).

Other arrangements of magnets 21, different from that explained above, may be used to obtain a uniform plasma density. For example, the separation between neighboring magnets at the center of the top plate 11 can be larger than that around the edge thereof. Or, as shown in FIG. 5, the magnets 21 may be arranged only close to the edge of the top plate 11 as a band. A radius r1 is that of the top plate 11 and a radius r2 is that of the circle region where the magnets are not placed. With these arrangements, the number of magnets 21 around the center of the top plate 11 is smaller than that close to the edge. That is, the magnetic flux density in and around the center of the top plate 11 is lower than that close to its edge.

Experimental results as to the plasma process based on the plasma processing system using the above-mentioned plasma source are explained. An experiment was carried out for two different magnet arrangements (I) and (II). These arrangements of magnets 21 and their magnetic field strengths have been explained. In the magnet arrangement (I), magnets 21 are placed with a uniform density on the top plate 11 as shown in FIG. 4. In the magnet arrangement (II), magnets 21 are arranged only within a region which lies between the radii r1 and r2 of the top plate 11 as shown in FIG. 5. The radius of the top plate 11 denoted by r1 is 240 mm, for example. The value of the radius r2 is 110 mm, for example. In both cases, Nd—Fe—B magnets with the dimensions of 10 mm×10 mm×12 mm were used. The magnets 21 were arranged with a separation of 40 mm to each other on the top plate 11. The strength of the magnetic field 23 on the surface of a magnet 21 is 915 kA/m (Br=12.1 kGrauss). The pattern and strength of the magnetic field below the top plate 11 were calculated by a computer simulation and data are shown in FIGS. 6, 7, 8, 9 and 10.

Figure 6:
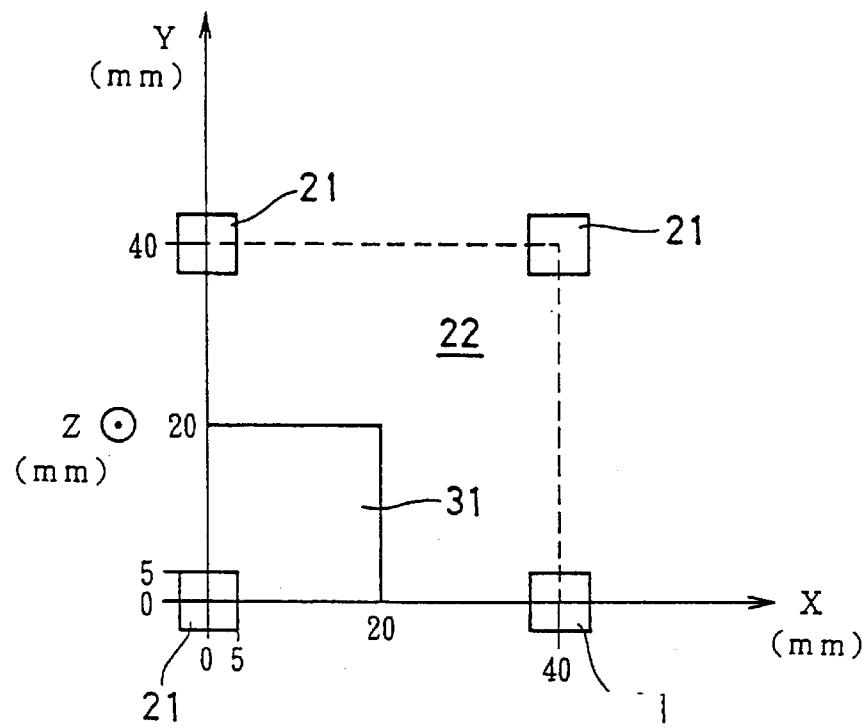
FIG. 6 is a view showing the structure of magnets and a square area used for a computer simulation on an X–Y plane at Z=0 mm.
Figure 7:
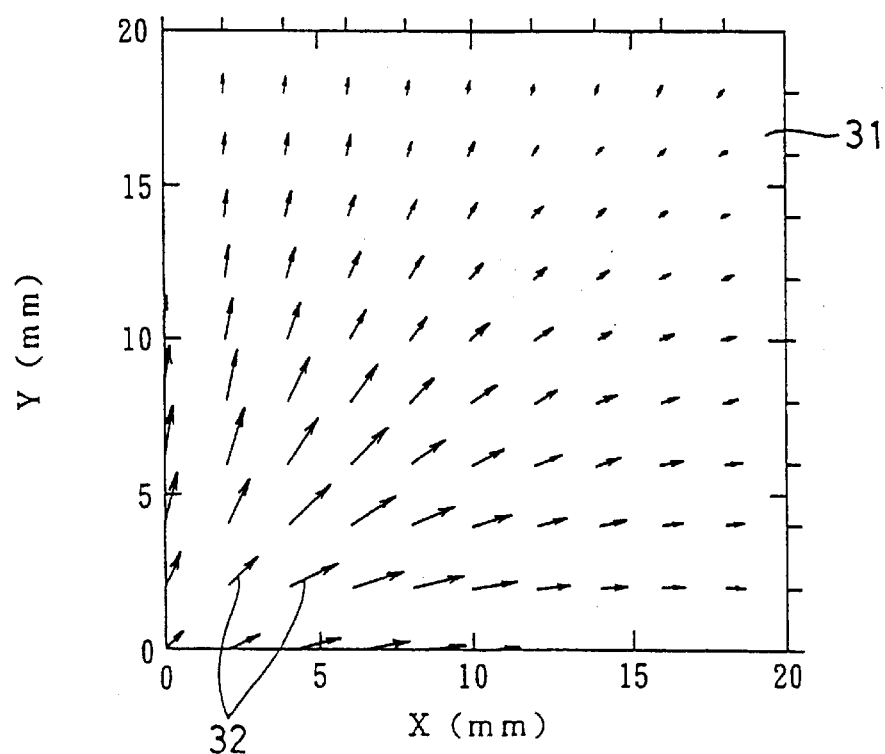
FIG. 7 is a view showing the strength and direction of magnetic flux lines in the square area on an X–Y plane at Z-0 mm.

FIGS. 6 and 7 show the structure of a magnet arrangement used for the simulation and the patterns of the generated magnetic flux. The square region 31 drawn by bold lines in FIG. 6 is used for the simulation. A lot of arrows 32 within the enlarged square region 31, as shown in FIG. 7, mean a distribution of strength and direction as to the generated magnetic field. A plane parallel to the top plate 11 is taken as X–Y plane. An axis normal to the X–Y plane is taken as Z axis. The upper surface of the top plate 11 is considered as Z=0 mm. Z is measured from the upper surface of the top plate 11 to the downstream. The top plate 11 is made of Al that is 18 mm thick.

Figure 8:
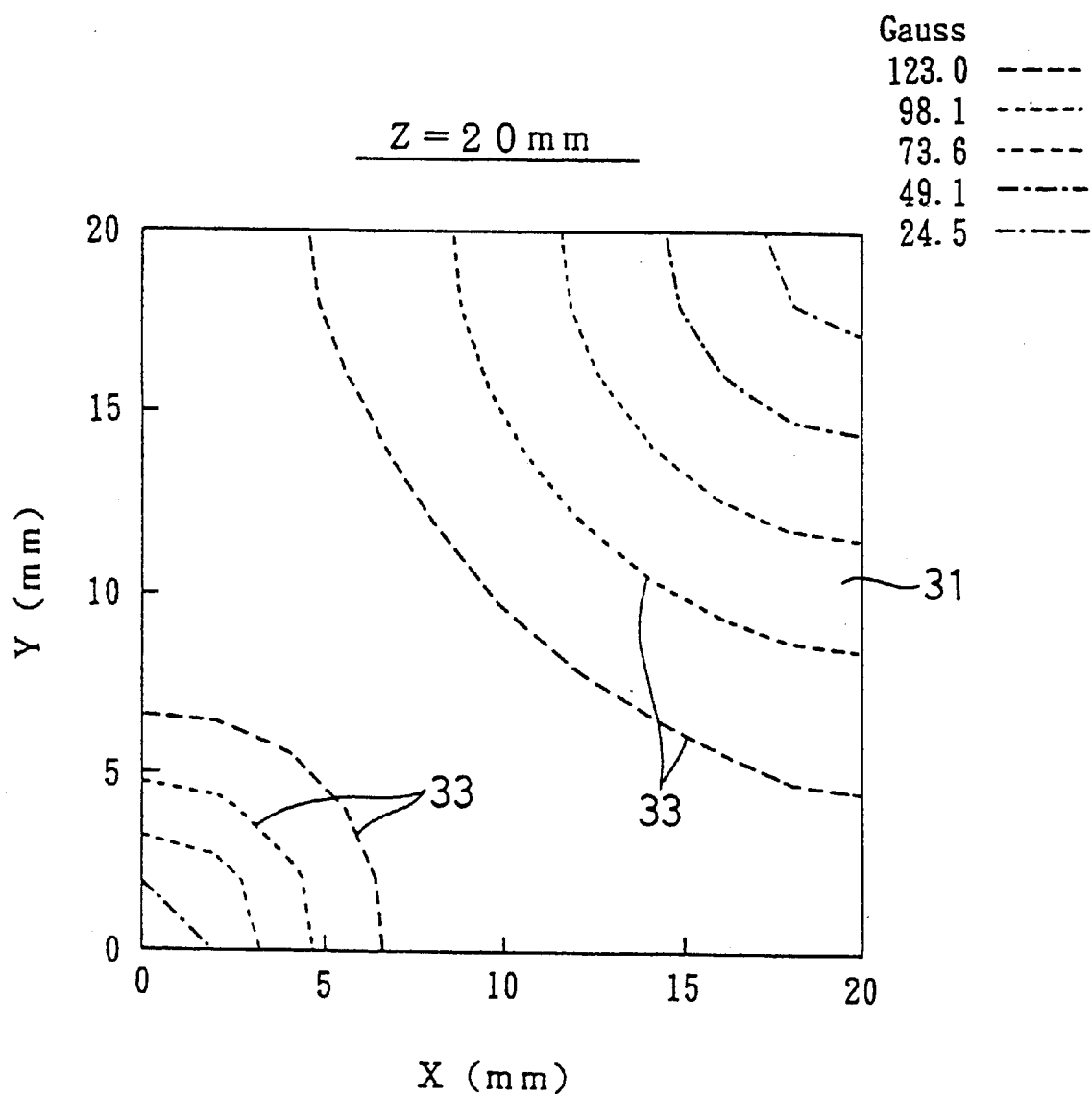
FIG. 8 is a view showing computer simulated contour lines of magnetic flux density in the square area on X–Y plane at Z=20 mm.
Figure 9:
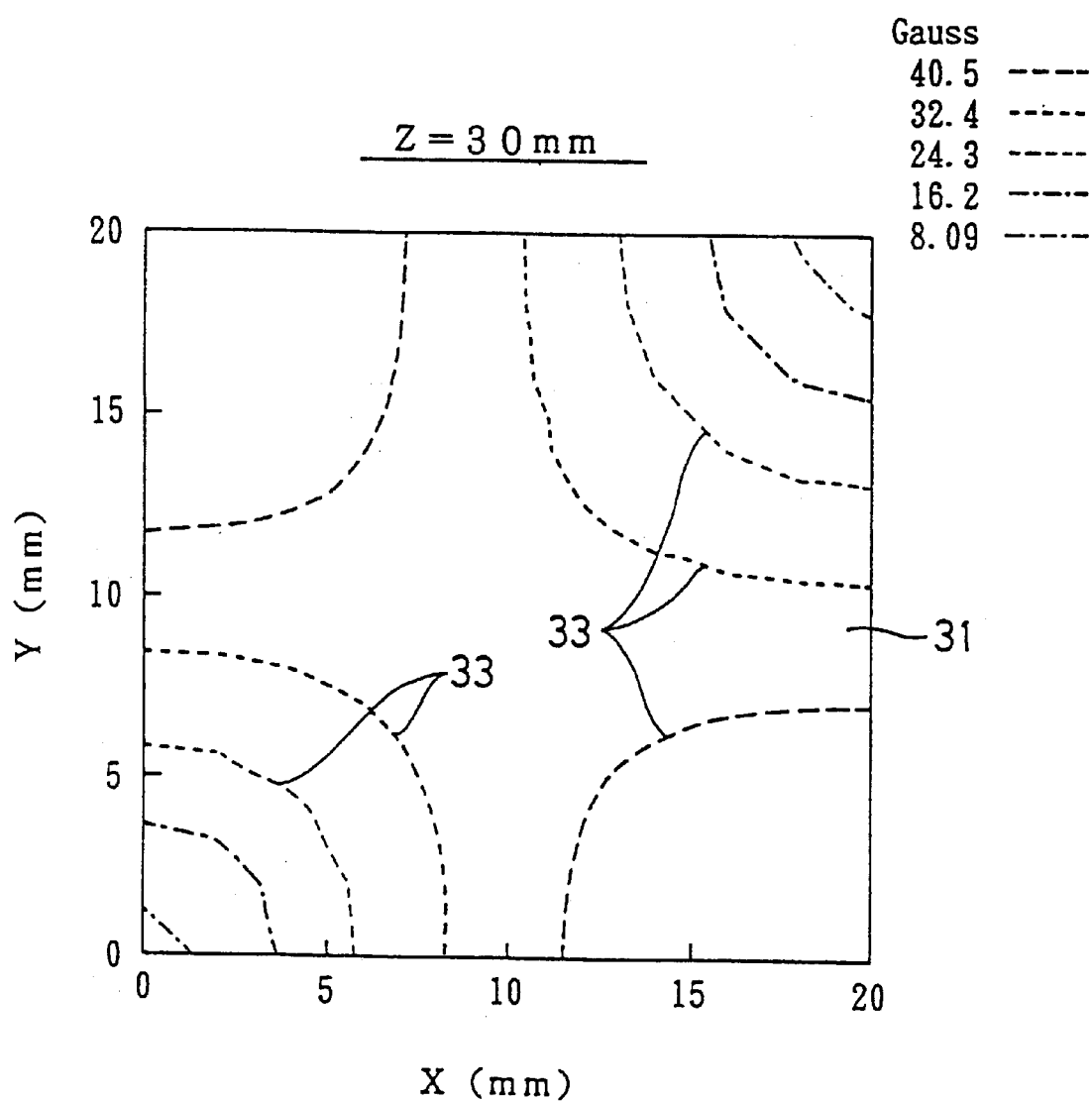
FIG. 9 is a view showing computer simulated contour lines of magnetic flux density in the square area on X–Y plane at Z=30 mm.
Figure 10:
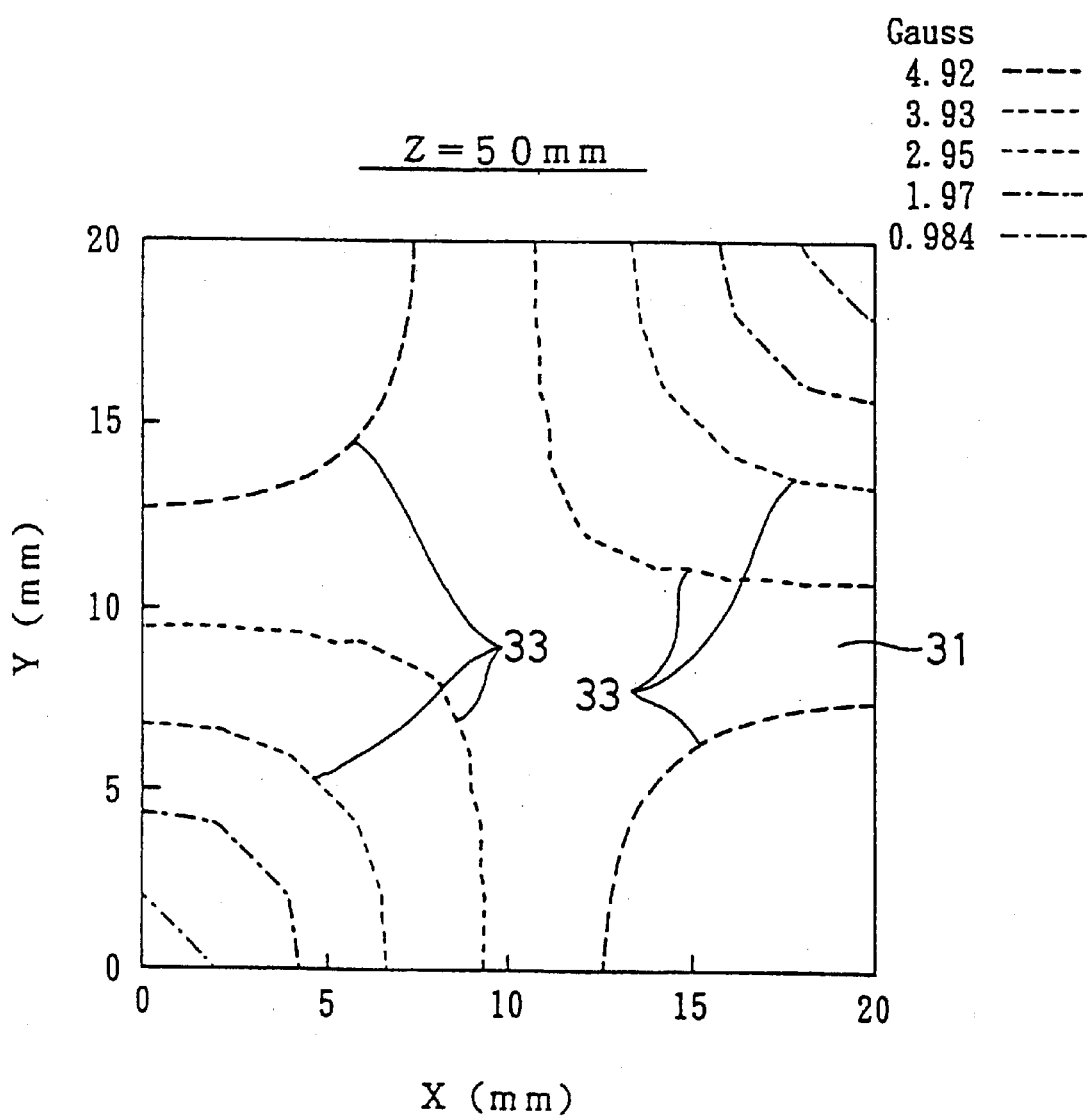
FIG. 10 is a view showing computer simulated contour lines of magnetic flux density in the square area on X–Y plane at Z=50 mm.

FIGS. 8, 9 and 10 show the contour lines 33 of magnetic flux in the enlarged square region 31 on X–Y planes at Z=20 mm, 30 mm and 50 mm, respectively. The strength of the magnetic field reduces with an increase of the distance from the top plate 11 to the downstream, as shown in FIGS. 8–10. At Z=50 mm, the strength of magnetic field is below 5 Gauss. Therefore, there is no influence by the magnetic field 23 on the reaction process that occurs on the surface of the substrate 17, if the substrate 17 is placed at Z>50 mm.

Figures 11, 12:
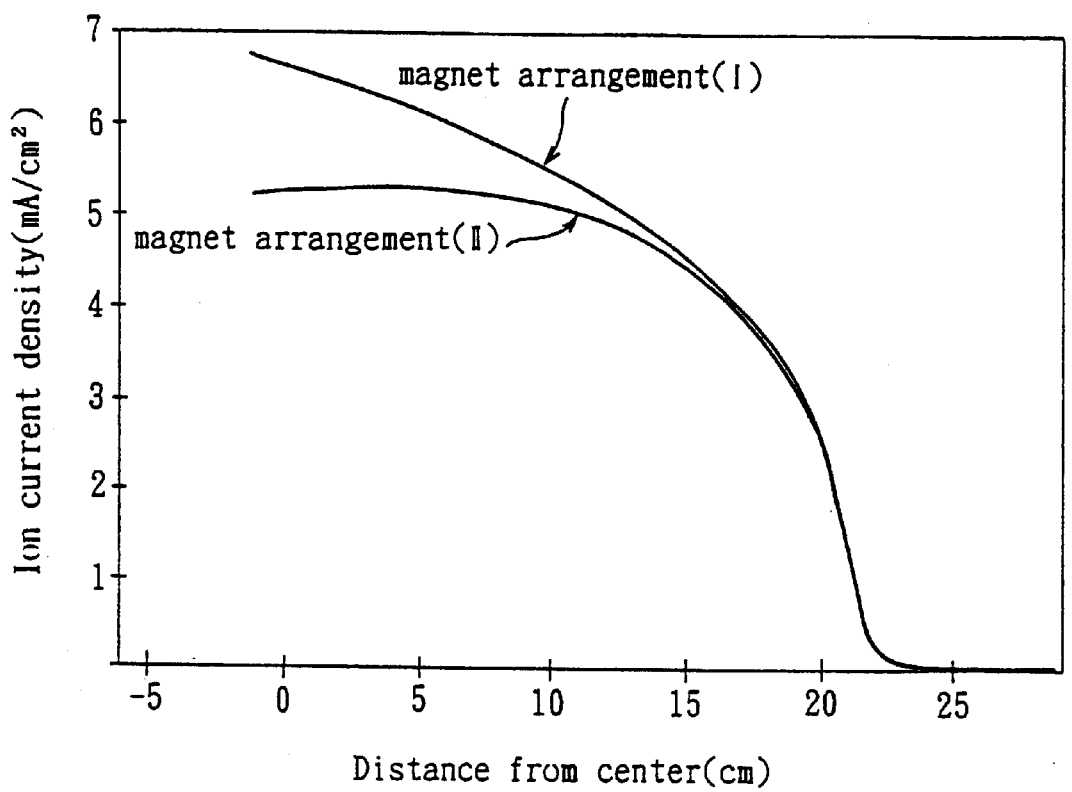
FIG. 11 is a graph showing a current density variation along a radial line at Z=−75 mm. P
FIG. 12 is a table indicating data of non-uniformity in the cases of the magnet arrangements (I) and (II).

With the magnet arrangements (I) and (II), a plasma was generated by applying an rf electric power of 1000 W operating at 13.56 MHz frequency. The pressure in the inside of the reactor 10 was set at 2 mTorr. Ar flowing at a rate of 100 sscm was used as the plasma gas. The ion current density of the plasma was monitored at a distance of 75 mm from the top plate 11 by using a Langmuire probe and their monitored graphs are shown in FIG. 11. The nonuniformity of the radial plasma density was estimated by a formula as [(Imax−Imin)/(Imax+Imin)](%) and data were given in Table 1 shown in FIG. 12. Here, Imax and Imin are the maximum and minimum ion current densities.

The experimental results point out that if the magnetic field pattern below the top plate 11 is uniform, the center of the reactor 10 shows a higher plasma density. When the high density plasma generation region is shifted towards the edge of the top plate 11 by removing the magnets 21 around the center, a radially uniform plasma can be obtained at a closer distance from the top plate 11.

Next, a second working example of the present invention will be explained. This second working example is explained with reference to FIG. 13. Except the configurations of the top plate and the magnet arrangement, all the other configurations are substantially the same as those in first working example.

Figure 13:
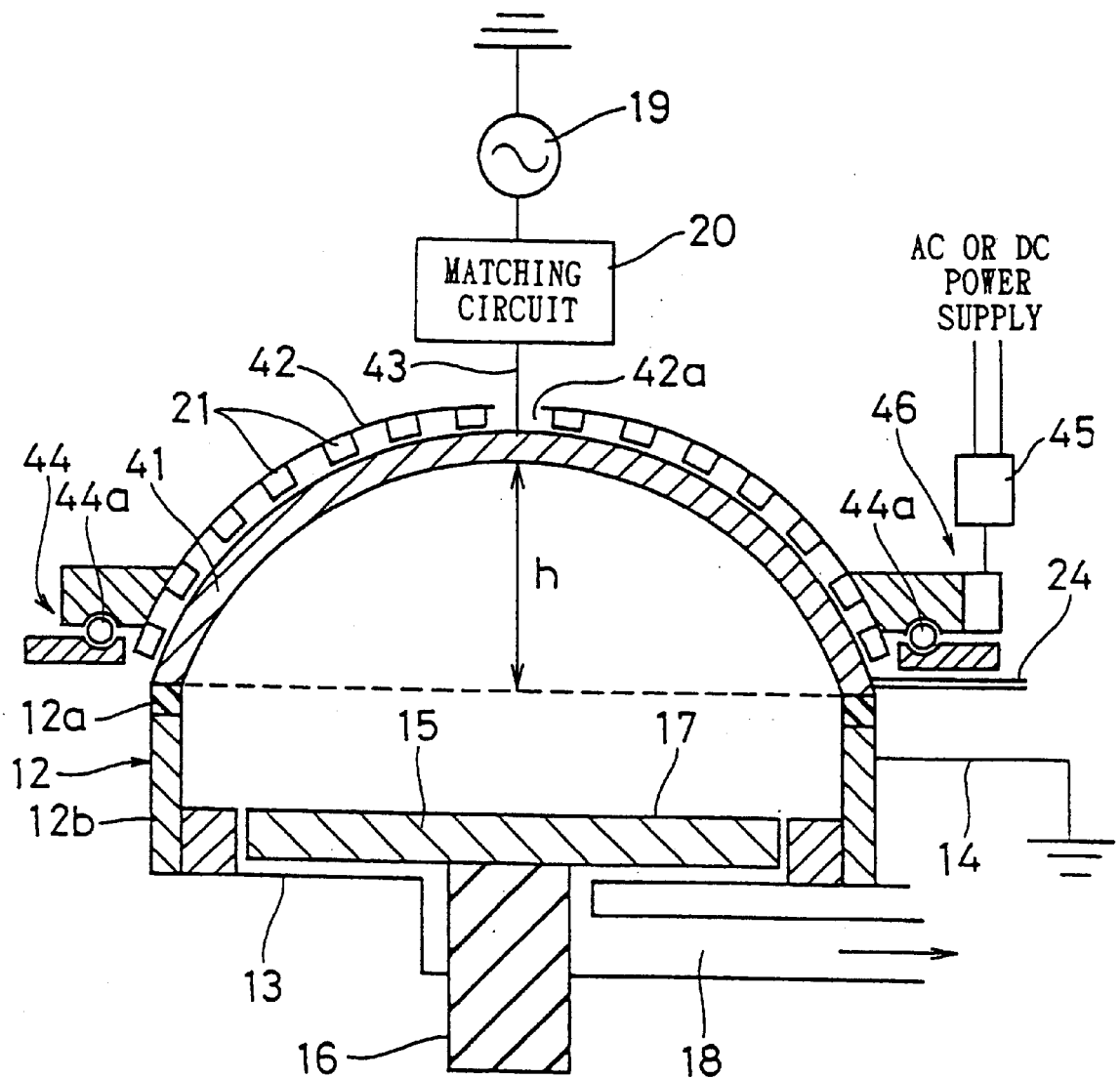
FIG. 13 is a vertical sectional view of a second working example showing an inner structure of a plasma processing system.
Figure 14:
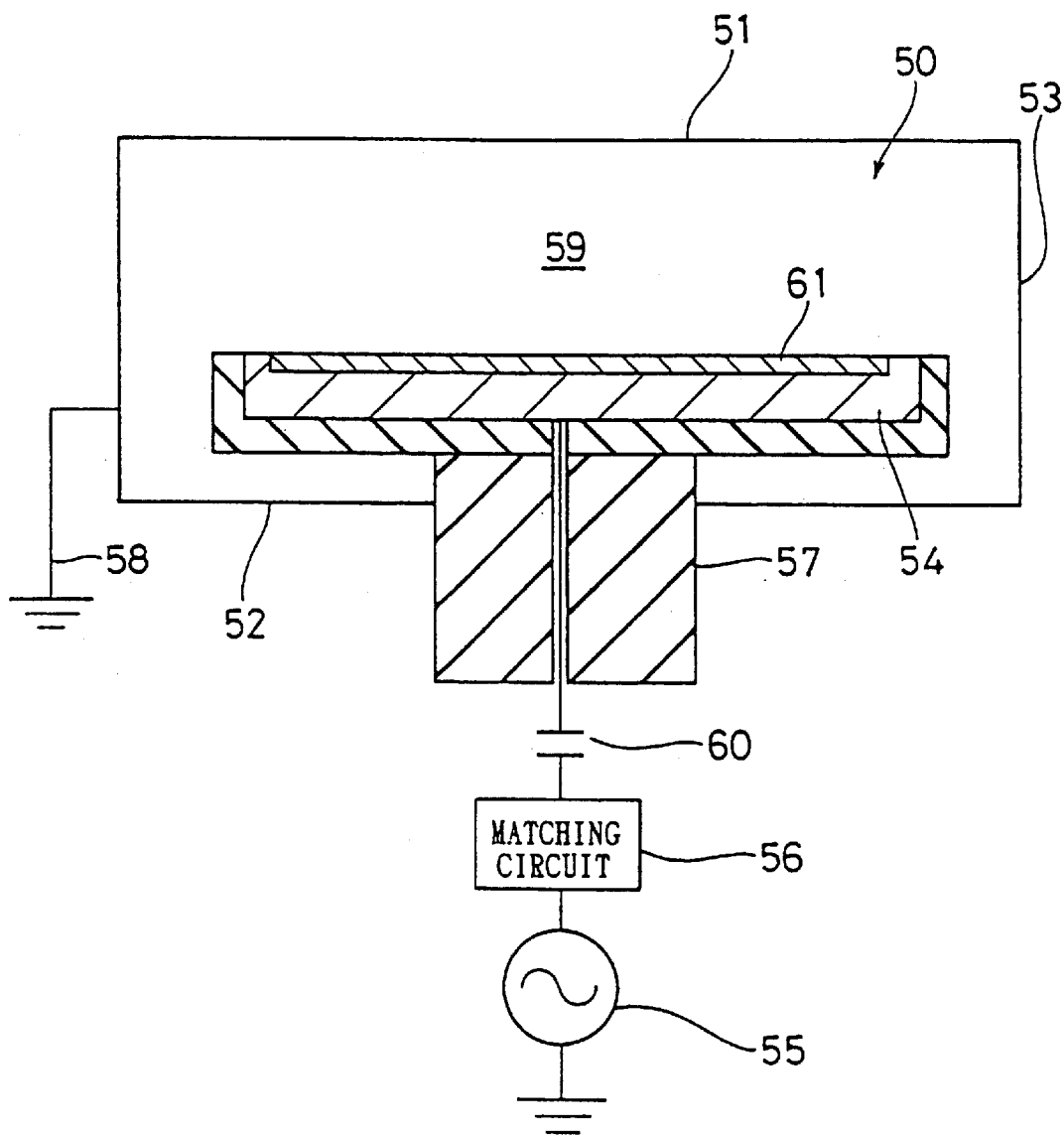
FIG. 14 is a schematic view showing a first conventional plasma source used for a plasma processing system.
Figure 15:
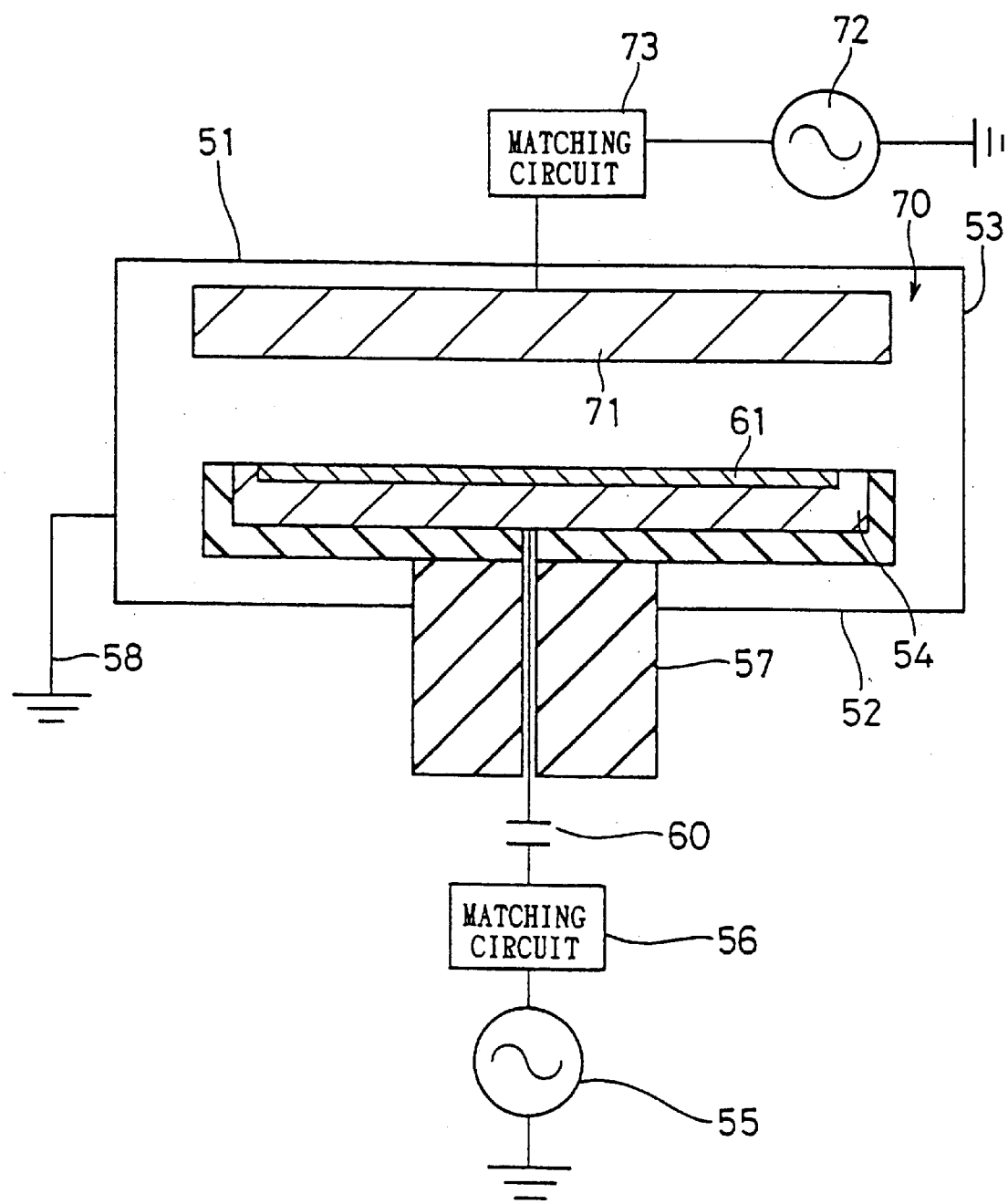
FIG. 15 is a schematic view showing a second conventional plasma source used for plasma processing system.

In FIG. 13, the reactor 10 forming the plasma source is configured by a top plate 41 made of a nonmagnetic metal, the cylindrical side wall 12 and the bottom plate 13. The lower part 12b of the cylindrical side wall 12 and the bottom plate 13 are made of a metal. The upper part 12a of the cylindrical side wall is made of a ceramic. The lower part 12b of the cylindrical side wall 12 and the bottom plate 13 are electrically grounded through the earth line 14. The reactor 10 is provided with a substrate holder 15 in its inside, which is mounted to the bottom plate by the insulator 16. The substrate 17 to be processed is loaded on the substrate holder 15. The gas outlet port 18 is formed in the bottom plate 13 below the substrate holder 15.

As shown in FIG. 13, the top plate 41 used in the second working example has a dome shape. Since the dome shaped configuration is generally much stronger than a flat shape configuration, the thickness of the top plate 41 can be considerably decreased. Further, the thickness at the center of the dome shaped top plate 41 can be made thinner than that at the open boundaries thereof. The inside radius of the dome shaped top plate 41 is not critical. Usually, the height of the dome shaped top plate 41, denoted as "h" in FIG. 13, may be in the range of 5 cm to 20 cm. This height basically depends on the radius of the cylindrical side wall 12. The radius of the cylindrical side wall 12 varies as stated in the first working example. In addition, the inside structure of the dome shaped top plate 41 is the same as the top plate 11.

The rf electric power is fed to the center of the dome shaped top plate 41 from the rf electric power source 19 through the matching circuit 20. The dome shaped top plate 41 operates as an electrode. The frequency and the other electrical properties of the rf power source 19 are the same as explained in the first working example.

The magnets 21 are fixed on the inner surface of a dome shaped cover 42 made of a metal. The dome shaped cover 42 is placed at the upper side of the dome shaped top plate 41. At the top of the dome shaped cover 42, a hole 42a having a diameter of 3 cm to 5 cm is made. This hole 42a is made in order to connect the rf power line 43 from the matching circuit 20 to the dome shaped top plate 41 which lies below the dome shaped cover 42. The arrangement of magnets 21 is the same as that explained in first working example. The dome shaped cover 42 to which the magnets 21 are fixed is supported on a wheel mechanism 44 and connected to an electric motor 45 through a gear mechanism 46. The dome shaped cover 42 is placed on bearings 44a of the wheel mechanism 44 so as to be rotatable around its axis. The electric motor 45 is connected to the outer surface of the dome shaped cover 42 through the gear mechanism 46. The electric motor 45 usually rotates the dome shaped cover 42 at a rotation frequency of 0.5 Hz (i.e. 180 degrees/second). However, the rotation frequency may be as high as 10 Hz. Thus, the dome shaped cover 42 with many magnets 21 can be rotated with a desired angular velocity by the electric motor 45. The separation between each of the magnets 21 fixed on the inner surface of the dome shaped cover 42 and the dome shaped top plate 41 is kept about 5 mm to 10 mm.

Technical advantages of the above-mentioned second working example will now be explained.

Since the thickness of the dome shaped top plate is thinner, a higher magnetic flux density results below the dome shaped top plate 41. This causes an increase of plasma density. Further, inexpensive low strength magnets can be used with this configuration.

The surface area of the dome shaped top plate is higher than that of the flat top plate used in first working example. This results in an increase of plasma generation volume.

The radial plasma density obtained by the first working example with the magnet arrangement (I) shows a higher plasma density at the center of the cylindrical chamber of the reactor. This tendency can be avoided with the use of the dome shaped top plate. When the dome shaped top plate is used, the plasma generation region in the center of the dome shaped top plate is farther from the substrate level in comparison with the plasma generation regions close to the cylindrical side wall. Therefore, the plasma generated at the vicinity of the center of the dome shaped top plate flows a longer distance compared to the plasma generated close to the cylindrical side wall. This causes a higher plasma density drop at the center of the cylindrical chamber. However, the drop of the plasma density at the center is compensated by the diffusion of plasma generated close to the cylindrical side wall. This results in a radially uniform plasma at the level of substrate.

In addition, magnets 21 arranged in the second working example are separated from the dome shaped top plate 41. This facilitates heating the dome shaped top plate which is needed for some wafer processing.

Another advantage is that, due to the rotation of the magnets 21 over the dome shaped top plate 41, the time average chemistry in the vicinity of the dome shaped top plate 41 becomes uniform. Therefore, if a film is deposited on the inner surface of the dome shaped top plate 41, the thickness of the film becomes uniform. Similarly, if etching is occurred on the inner surface of the dome shaped top plate 41, the etched profile over the entire surface becomes the same. This eases the cleaning process of the reactor 10. However, the mechanism to rotate the magnets 21 in the second working example can also be adopted by fixing the magnets on a separate plate and mounting it slightly over the top plate.

The plasma processing system in accordance with the present invention can yield a uniformly distributed large area high density plasma at a plane over the surface of the substrate, and realizes a plasma source with a lower aspect ratio.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A plasma processing system, comprising:
   a reactor including a capacitively coupled plasma source, a substrate holder, a top plate made of a nonmagnetic metal and having an inner surface and an outer surface, a bottom plate made of a metal, and a side wall having at least in part a section made of a dielectric material, wherein the substrate holder is placed in said bottom plate; and
   a pluralaity of magnets separately arranged on the outer surface of the top plate, wherein the magnets are arranged in a noncircular configuration with respect to a center of said top plate, wherein the magnets are arranged in an orthogonal configuration along perpendicular linear lines such that a polarity of each of the magnets facing the inside of the reactor is opposite that of linearly adjacent magnets and the same as diagonally adjacent magnets, and said magnets generate a magnetic field with closed magnetic fluxes near the inner surface of said top plate.

2. A plasma processing system as claimed in claim 1, wherein said top plate is of a planar circular shape, and said magnets are directly fixed to the outer surface of said planar top plate.

3. A plasma processing system as claimed in claim 1, wherein said top plate is of a dome shape.

4. A plasma processing system as claimed in claim 3, wherein said magnets are arranged on an inner surface of a dome shaped cover that lies over said dome shaped top plate.

5. A plasma processing system as claimed in claim 1, wherein said top plate is electrically isolated from the rest of said reactor by placing said top plate on said section made of a dielectric material.

6. A plasma processing system as claimed in claim 1, wherein said top plate is supplied with rf electrical power.

7. A plasma processing system as claimed in claim 2, wherein said magnets are arranged on an edge region of said top plate leaving a magnetic field-free region in a center of said top plate.

8. A plasma processing system as claimed in claim 4, wherein said dome shaped cover is rotated by means of an electric motor.

9. A plasma processing system as claimed in claim 2, wherein said top plate is electrically isolated from the rest of said rector by placing said top plate on said section made of a dielectric material.

10. A plasma processing system as claimed in claim 3, wherein said top plate is electrically isolated from the rest of said reactor by placing said top plate on said section made of a dielectric material.

11. A plasma processing system as claimed in claim 4, wherein said top plate is electrically isolated from the rest of said rector by placing said top plate on said section made of a dielectric material.

12. A plasma processing system as claimed in claim 2, wherein said top plate is supplied with rf electrical power.

13. A plasma processing system as claimed in claim 3, wherein said top plate is supplied with rf electrical power.

14. A plasma processing system as claimed in claim 4, wherein said top plate is supplied with rf electrical power.

15. A plasma processing system as claimed in claim 5, wherein said top plate is supplied with rf electrical power.

* * * * *